(12) United States Patent
Konno et al.

(10) Patent No.: US 8,569,731 B2
(45) Date of Patent: Oct. 29, 2013

(54) NONVOLATILE MEMORY DEVICE AND METHOD FOR MANUFACTURING SAME

(75) Inventors: Takuya Konno, Kanagawa-ken (JP); Hiroyuki Fukumizu, Mie-ken (JP); Kazuhito Nishitani, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 686 days.

(21) Appl. No.: 12/726,743

(22) Filed: Mar. 18, 2010

(65) Prior Publication Data

US 2010/0244114 A1 Sep. 30, 2010

(30) Foreign Application Priority Data

Mar. 25, 2009 (JP) ................... 2009-075275

(51) Int. Cl.
*H01L 47/00* (2006.01)
(52) U.S. Cl.
USPC ................................... 257/4; 257/5
(58) Field of Classification Search
USPC ............ 257/2–5, E27.004, E27.026, E27.07, 257/E31.001, E31.027, 900
See application file for complete search history.

(56) References Cited

U.S. PATENT DOCUMENTS

| | | |
|---|---|---|
| 2007/0293027 A1 | 12/2007 | Konno et al. |
| 2009/0127538 A1* | 5/2009 | Ryoo et al. ............. 257/5 |
| 2009/0230505 A1* | 9/2009 | Dennison .............. 257/522 |

FOREIGN PATENT DOCUMENTS

| | | |
|---|---|---|
| JP | 7-273297 | 10/1995 |
| JP | 2006-86195 | 3/2006 |
| JP | 2007-5696 | 1/2007 |
| JP | 2008-47870 | 2/2008 |
| JP | 2008-53535 | 3/2008 |
| JP | 2008-218855 | 9/2008 |
| JP | 2008-235637 | 10/2008 |
| JP | 2009-10424 | 1/2009 |
| WO | WO 2005/067051 A1 | 7/2005 |
| WO | WO 2006/025363 A1 | 3/2006 |

OTHER PUBLICATIONS

Office Action issued Apr. 11, 2011, in Japan Patent Application No. 2009-075275 (with English translation).

* cited by examiner

*Primary Examiner* — Hung Vu
(74) *Attorney, Agent, or Firm* — Oblon, Spivak, McClelland, Maier & Neustadt, L.L.P.

(57) ABSTRACT

A nonvolatile memory device includes: at least one first interconnection extending in a first direction; at least one second interconnection disposed above the first interconnection and extending in a second direction nonparallel to the first direction; a memory cell disposed between the first interconnection and the second interconnection at an intersection of the first interconnection and the second interconnection and including a memory element; and an element isolation layer disposed between the memory cells. At least one dielectric film with a higher density than the element isolation layer is disposed on a sidewall surface of the memory cell.

4 Claims, 16 Drawing Sheets

NONVOLATILE MEMORY DEVICE AND METHOD FOR MANUFACTURING SAME

CROSS-REFERENCE TO RELATED APPLICATIONS

This application is based upon and claims the benefit of priority from the prior Japanese Patent Application No. 2009-75275, filed on Mar. 25, 2009; the entire contents of which are incorporated herein by reference.

BACKGROUND

1. Field

Embodiments of the invention relate generally to a nonvolatile memory device and a method for manufacturing the same.

2. Description of the Related Art

Nonvolatile memory such as NAND flash memory is used widely for large-capacity data storage in mobile telephones, digital still cameras, USB (Universal Serial Bus) memory, silicon audio, and the like. The market continues to grow due to the reduction of manufacturing costs per bit enabled by rapid downsizing. Further, new applications are also rapidly sprouting up and lead to a virtuous cycle where downsizing and manufacturing cost reduction cultivate a new market.

In particular, NAND flash memory provides an actual crosspoint cell by a gate conductor ("GC") line perpendicular to areas ("AA") and is rapidly downsized due to its simple structure. Consequently, NAND flash memory leads microfabrication of semiconductor nowadays, and the minimum feature size reaches 60 nm or less even at volume production level.

However, NAND flash memory utilizes a transistor operation that records information by using a threshold voltage shift. It is considered that transistor improvements in highly-uniform characteristics, high reliability, high-speed operations, and high integration will reach a limit. The development of a new nonvolatile memory is desirable.

Under such circumstances, for example, resistance change elements or phase change memory elements operate by utilizing a variable resistance state of a resistive material. Therefore, a transistor operation is unnecessary during programming/erasing operation, and device characteristics improve as the size of the resistive material is reduced. Hence, this technology is expected to respond to future needs by achieving more-highly-uniform characteristics, higher reliability, higher-speed operations, and higher densities (for example, JP-A 2008-235637 (Kokai)).

However, memory cells including a resistance change element or the like are usually insulated from each other by an element isolation layer. These days, the space between memory cells is downsized as the downsizing of device proceeds.

Therefore, an element isolation structure of higher quality is desirable. For example, the element isolation layer preferably has a structure that does not deteriorate the memory cell, has high insulation properties, and can suppress malfunction.

SUMMARY

According to an aspect of the invention, there is provided a nonvolatile memory device including: at least one first interconnection extending in a first direction; at least one second interconnection disposed above the first interconnection and extending in a second direction nonparallel to the first direction; a memory cell disposed between the first interconnection and the second interconnection at an intersection of the first interconnection and the second interconnection and including a memory element; and an element isolation layer disposed between the memory cells, at least one dielectric film with a higher density than the element isolation layer being disposed on a sidewall surface of the memory cell.

According to another aspect of the invention, there is provided a method for manufacturing a nonvolatile memory device, the device including: at least one first interconnection extending in a first direction; at least one second interconnection disposed above the first interconnection and extending in a second direction nonparallel to the first direction; a memory cell disposed between the first interconnection and the second interconnection at an intersection of the first interconnection and the second interconnection and including a memory element; and an element isolation layer disposed between the memory cells, at least one dielectric film with a higher density than the element isolation layer being disposed on a sidewall surface of the memory cell, the method including: forming the dielectric film by an atomic layer deposition method or a molecular layer deposition method.

According to another aspect of the invention, there is provided a method for manufacturing a nonvolatile memory device, the device including: at least one first interconnection extending in a first direction; at least one second interconnection disposed above the first interconnection and extending in a second direction nonparallel to the first direction; a memory cell disposed between the first interconnection and the second interconnection at an intersection of the first interconnection and the second interconnection and including a memory element; and an element isolation layer disposed between the memory cells, at least one dielectric film with a higher density than the element isolation layer being disposed on a sidewall surface of the memory cell, the method including: forming a precursor film serving as of the dielectric film and performing oxidation treatment or nitriding treatment on the precursor film to form the dielectric film.

DETAILED DESCRIPTION

Hereinbelow, embodiments of the invention are described with reference to the drawings.

First Embodiment

Figure 1A:
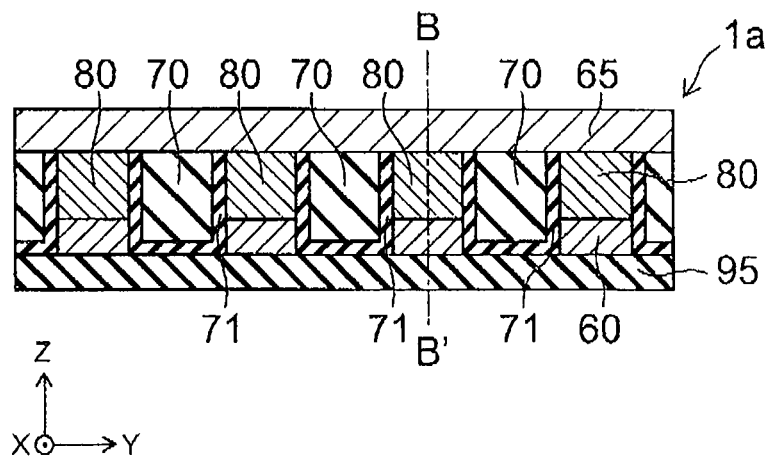
FIGS. 1A and 1B are schematic cross-sectional views of relevant parts of cell cross-sectional structures of a nonvolatile memory device.
Figure 1B:
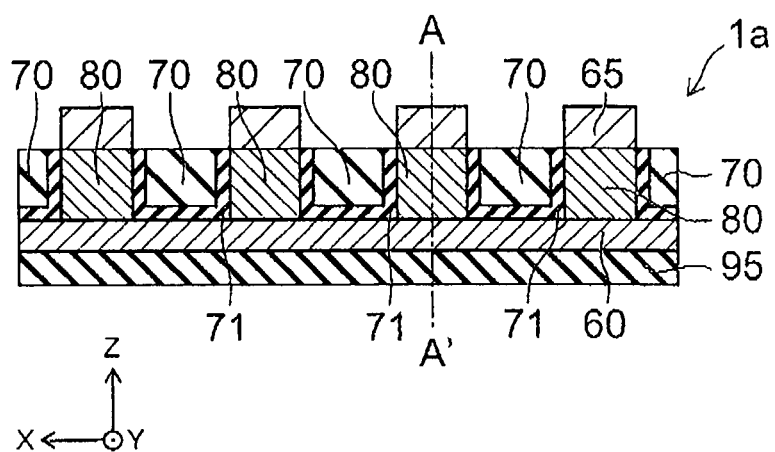

FIGS. 1A and 1B are schematic cross-sectional views of relevant parts of cell cross-sectional structures of a nonvolatile memory device according to this embodiment. Here, FIG. 1A illustrates a cross section taken along line A-A' of FIG. 1B, and FIG. 1B illustrates a cross section taken along line B-B' of FIG. 1A. The arrows at the lower left of the drawings express directions in regard to the device, for example, an X axis, a Y axis perpendicular to the X axis, and a Z axis perpendicular to the X axis and the Y axis in a three-dimensional coordinate As illustrated in FIG. 1A, in a ReRAM memory cell array 1a, interconnection layers 60 (lower interconnections) that are bit lines are provided on a substrate 95, memory cells (unit memory cells) 80 are provided on the interconnection layer 60, and interconnection layers 65 are provided on the memory cells 80.

Here, the interconnection layer 60 extends in a first direction (the X-axis direction), and the interconnection layer 65 extends in a second direction (the Y-axis direction in the drawings) nonparallel to the first direction. That is, the memory cell 80 is disposed between the interconnection layer 60 and the interconnection layer 65 that intersect with each other.

Further, in the ReRAM memory cell array 1a, element isolation layers 70 are disposed periodically in order to ensure insulation properties between adjacent cells. Here, the element isolation layer 70 is formed by an application method such as spin coating, and is what is called a low-k material. A dielectric film 71 is disposed between the element isolation layer 70, and the memory cell 80 and the interconnection layer 60.

The dielectric film 71 is formed by the ALD (atomic layer deposition) method, for example, and is configured to have a uniform film thickness and a dense film quality. That is, the dielectric film 71 is configured to have a higher density than the element isolation layer 70. Since in general the dielectric constant of a dielectric film increases as the density thereof increases, the dielectric film 71 is configured to have a higher dielectric constant than the element isolation layer 70.

The substrate 95 is an inter-layer dielectric film formed on a semiconductor substrate, for example, and a CMOS (Complementary Metal Oxide Semiconductor) circuit and the like are disposed below the inter-layer dielectric film.

In the nonvolatile memory device, a plurality of such ReRAM memory cell arrays is may be stacked via an inter-layer dielectric film (stacked in the Z-axis direction in the drawings). Thereby, a memory device of a larger memory capacity is obtained.

Figure 2:
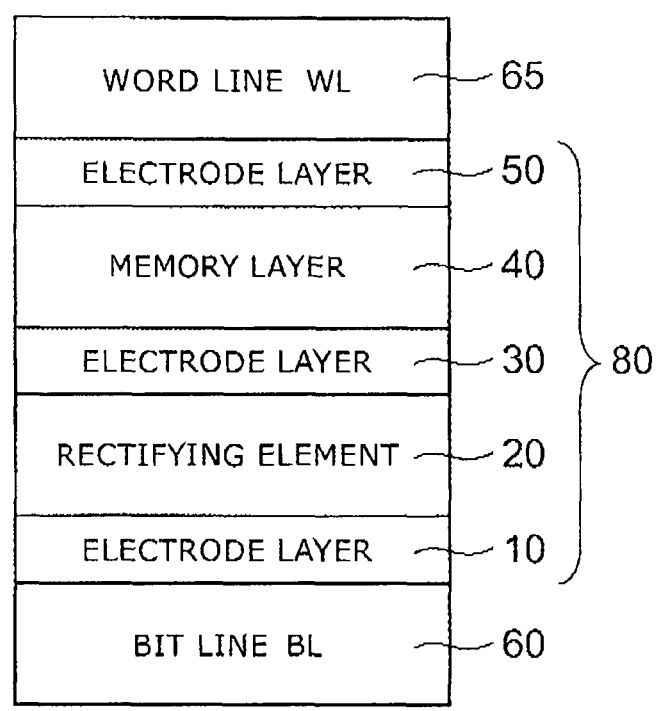
FIG. 2 is a schematic cross-sectional view of relevant parts of cell cross-sectional structures of a nonvolatile memory device.

FIG. 2 is a schematic cross-sectional view of a relevant part of a cell cross-sectional structure of the nonvolatile memory device according to this embodiment. FIG. 2 illustrates an enlarged view of the memory cell 80.

In the memory cell 80, the interconnection layer 60 is an under layer, and an electrode layer 10, a diode layer 20 that is a rectifying element, an electrode layer 30, a resistance change film 40 that is a memory element, and an electrode layer 50 are disposed in this order from the lower layer to the upper layer. The memory cell 80 has a configuration in which the diode layer 20 and the resistance change film 40 are connected in series and a current flows in one direction of the memory cell 80.

When a current is supplied to each resistance change film 40 via the interconnection layer 65 and the interconnection layer 60, the resistance change film 40 can transit reversibly between a first state and a second state.

Here, tungsten (W), which is excellent in high-temperature heat resistance and has a low resistivity, for example, is used for the material of the interconnection layers 65 and 60. Furthermore, tungsten nitride (WN) and tungsten carbide (WC) may be used.

Titanium (Ti), titanium nitride (TiN), and the like, for example, are used for the material of the electrode layers 10, 30, and 50.

Although this embodiment illustrates the case where a resistance change element is used as an example of the memory element, a phase change film may be used in place of the resistance change film 40 to form a phase change memory element.

The voltage applied between the major surfaces of the resistance change film 40 changes by the combination of the potentials applied to the interconnection layer 65 and the interconnection layer 60, and thus the resistance change film 40 can record and erase information by characteristics (for example, resistance value) of the resistance change film 40. Accordingly, any material of which characteristics change by an applied voltage may be used for the resistance change film 40.

For example, a variable resistance layer of which the resistance value can transit reversibly by an applied voltage, a phase change layer that can transit reversibly between a crystal state and an amorphous state, and the like are used as the material of the resistance change film 40. The resistance change film 40 may be an anti-fuse element.

A specific material of the resistance change film 40 may be a material including at least one selected from $ZnMn_xO_y$, $ZnFe_xO_y$, $NbO_x$, Cr-doped $SrTiO_{3-x}$, $Pr_xCa_yMnO_z$, $ZrO_x$, $NiO_x$, Ti-doped $NiO_x$ film, $ZnO_x$, $TiO_x$, $TiO_xN_y$, $CuO_x$, $GdO_x$, $CuTe_x$, $HfO_x$, chalcogenide-based GST ($Ge_xSb_yTe_z$) of which the resistance state changes by the Joule heat generated by a voltage applied thereacross, N-doped GST and O-doped GST made by performing doping on GST, $Ge_xSb_y$, $In_xGe_yTe_z$, and the like.

Furthermore, in regard to the configuration of the resistance change film 40, the film itself may be a MIM (metal-insulator-metal) structure.

For example, a configuration may be possible that disposes the oxide film or the chalcogenide-based material described above in the middle, and thereon and therebelow disposes a material including at least one selected from tungsten nitride (WN), titanium nitride (TIN), titanium aluminum nitride (Al-TiN), tantalum nitride (TaN), titanium nitride silicide (TiNSi), tantalum carbide (TaC), titanium silicide (TiSi), tungsten silicide (WSi), cobalt silicide (CoSi), nickel silicide (NiSi), nickel platinum silicide (NiPtSi), platinum (Pt), ruthenium (Ru), platinum rhodium (PtRh), iridium (Ir), and the like.

The material of the element isolation layer 70 has a lower density (or dielectric constant) than the dielectric film 71, and may be, for example, silicon oxide ($SiO_2$), FSG (SiOF), BSG ($SiO_2$-$B_2O_3$, SiOB), HSQ ((Si—H)-containing $SiO_2$), porous silica, carbon-containing porous silica, carbon-containing $SiO_2$ (SiOC), MSQ ((methyl group)-containing $SiO_2$), porous MSQ, polyimide-based polymer resin, parylene-based polymer resin, polytetrafluorethylene-based polymer resin, amorphous carbon, fluorine-containing amorphous carbon, or the like.

The relative dielectric constant k of the element isolation layer 70 is, for example, silicon oxide (k<3.9), FSG (k=3.4 to 3.6), BSG (k=3.5 to 3.7), HSQ (k=2.8 to 3.0), porous silica (k<3.0), carbon-containing porous silica (k<3.0), carbon-containing $SiO_2$ (k=2.7 to 2.9), MSQ (k=2.7 to 2.9), porous MSQ (k=2.4 to 2.7), polyimide-based polymer resin (k=3.0 to 3.5), parylene-based polymer resin (k=2.7 to 3.0), polytetrafluoroethylene-based polymer resin (k=2.0 to 2.4), amorphous carbon (k<2.5), or fluorine-containing amorphous carbon (k<2.5).

The material of the dielectric film 71 has a higher density (or dielectric constant) than the element isolation layer 70, and may be, for example, silicon oxide ($SiO_2$), silicon nitride ($Si_3N_4$), aluminum nitride (AlN), or alumina ($Al_2O_3$). The densities n thereof are, for example, silicon oxide (n=approximately 2.2 g/cm$^3$), silicon nitride (n=2.4 to 3.1 g/cm$^3$), aluminum nitride (n=approximately 3.2 g/cm$^3$), and alumina (n=approximately 4.0 g/cm$^3$). The relative dielectric constant k of the dielectric film 71 is silicon oxide (k≥3.9), silicon nitride (k=7 to 8), aluminum nitride (k=8 to 9), and alumina (k=approximately 10). Furthermore, silicon oxynitride (SiON), hafnia (HfO$_2$), and the like, which have a higher density than the element isolation layer 70, may be used as the material of the dielectric film 71.

The memory cell 80 includes the diode layer 20 as a rectifying element, as described above. Thereby, even if an arbitrary memory cell 80 is selected by the combination of the interconnection layer 65 and the interconnection layer 60, the direction of a current flowing in the memory cell 80 is regulated.

The material of the diode layer 20 is mainly made of polysilicon (poly-Si), for example. Alternatively, amorphous silicon, epitaxial silicon, metal silicon, and the like may be used. A PIN diode, PN junction diode, Schottky diode, Zener diode, and the like, for example, are used as the diode layer 20.

Furthermore, semiconductor materials such as germanium (Ge) as well as silicon (Si) and semiconductor materials of metal oxide such as NiO, TiO, CuO, and InZnO may be used in combination as the diode layer 20.

A heat sink layer (not illustrated) may be interposed near the resistance change film 40 in order to perform heating of the resistance change film 40 efficiently during reset (erasing) operation.

Next, a method for manufacturing the ReRAM memory cell array 1a of the nonvolatile memory device will now be described.

FIG. 3A to FIG. 8B are schematic cross-sectional views of relevant parts for describing a method for manufacturing the ReRAM memory cell array 1a of the nonvolatile memory device.

Figure 3A:
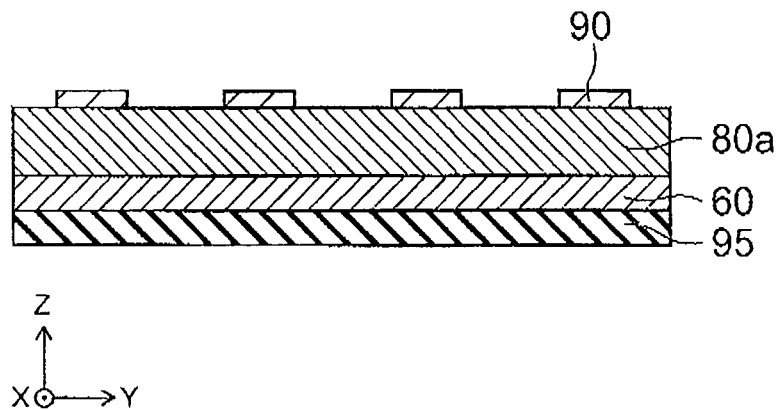
FIG. 3A to FIG. 8B are schematic cross-sectional views of relevant parts for describing a method for manufacturing the ReRAM memory cell array of the nonvolatile memory device.

First, as illustrated in FIG. 3A, the planar (whole flat) interconnection layer 60 to be processed into stripe-shaped interconnections and the planar stacked body 80a to be processed into the form of the memory cells 80 are formed.

Here, FIG. 3A illustrates a cross section when the stacked body 80a and the like are cut substantially perpendicularly to the X-axis direction.

That is, the planar not-divided interconnection layer 60, the planar electrode layer 10, the diode layer 20, the electrode layer 30, the resistance change film 40, and the electrode layer 50 (see FIG. 2) are film-formed on the substrate 95 by the sputtering method or the CVD (chemical vapor deposition) method. The interconnection layer 60 and the stacked body 80a are configured to have a thickness of 300 nm or more, for example. Heating treatment may be performed on the diode layer 20 and the resistance change film 40 as necessary.

Subsequently, a mask member 90 extending in the X-axis direction is patterned on the stacked body 80a by the lithography technique or the like. Silicon oxide ($SiO_2$), for example, is used for the material of the mask member 90.

Figure 3B:
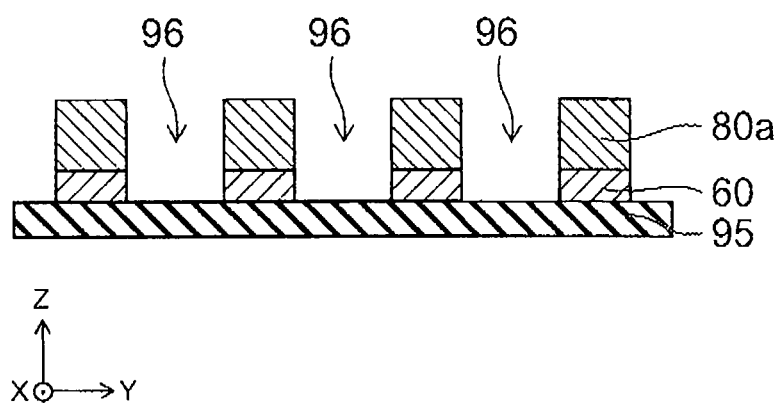

Next, as illustrated in FIG. 3B, the stacked body 80a and the interconnection layer 60 are processed by RIE (reactive ion etching) using the mask member 90 as a mask. Here, FIG. 3B illustrates a cross section when the stacked body and the like are cut substantially perpendicularly to the X-axis direction.

That is, the stacked body 80a and the interconnection layer 60 are processed into stripe shapes by etching. Thereby, the stacked body 80a is divided in the Y-axis direction across trenches 96, and the interconnection layers 60 extending in the X-axis direction are formed on the substrate 95. The width in the Y-axis direction of the trench 96 is 40 nm, for example.

The RIE in this stage is performed while changing etching conditions for each coating film of the stacked body. For example, it is performed while changing gas for etching, discharge conditions, and the like for each coating film.

Specifically, halogen-based gas is used when etching the resistance change film 40. Here, $Cl_2$, $BCl_3$, and the like, for example, are used as the halogen-based gas. In the case where a material having a high vapor pressure is selected as the material of the resistance change film 40, the etching processing of the resistance change film 40 may be performed while heating.

When etching the electrode layers 10, 30 and 50, and the interconnection layer 60, a gas containing halogen-based gas is used. $NF_3$, $Cl_2$, and the like, for example, are used as the halogen-based gas.

Figure 4A:
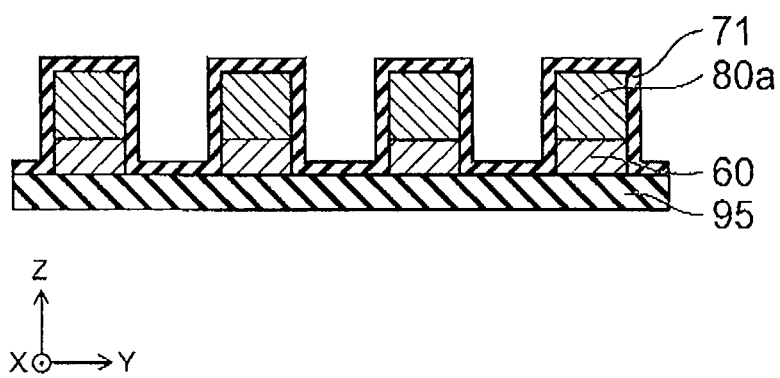

Next, as illustrated in FIG. 4A, the sidewall surface of the divided stacked body 80a and the like are covered with the dielectric film 71. Here, FIG. 4A illustrates a cross section when the stacked body and the like are cut substantially perpendicularly to the X-axis direction.

That is, the upper and sidewall surfaces of the divided stacked body 80a, the sidewall surface of the interconnection layer 60, the surface of the substrate 95 on which the interconnection layer 60 is not disposed are covered with the dielectric film 71.

Here, the dielectric film 71 is formed by the ALD (atomic layer deposition) method, as described above. In regard to the source gas, for example, when silicon oxide is used for the material of the dielectric film 71, dichlorosilane ($SiH_2Cl_2$), tetrachlorosilane ($SiCl_4$), hexachlorosilane ($Si_2Cl_6$), tris(dimethylamino)silane (TDMAS; $SiH(N(CH_3)_2)_3$), and the like are used for the source gas. The source gas is processed to be mixed with the gas of oxygen, ozone, oxygen radical, water, and the like. The processing temperature is 300° C. to 500° C.

Such ALD methods are good in step coverage properties, and the component elements are stacked with the thickness of an atomic layer. Accordingly, the dielectric film 71 formed in the trench 96 has a configuration of a uniform film thickness and a dense film quality. For example, even if the trench 96 before formation of the dielectric film 71 and the element isolation layer 70 has a high aspect ratio (for example, aspect ratio >40), the dielectric film 71 having a uniform film thickness and a dense film quality is formed in the trench 96. The aspect ratio in this embodiment is defined as (the depth of the trench 96)/(the width of the trench 96).

The dielectric film 71 may be formed by the molecular layer deposition (MLD) method as well as the ALD method. Also the molecular layer deposition (MLD) method forms a coating film having a uniform film thickness and a dense film quality described above.

The dielectric film 71 may be formed by the chemical vapor deposition (CVD) method or the physical vapor deposition (PVD) method as necessary.

Figure 4B:
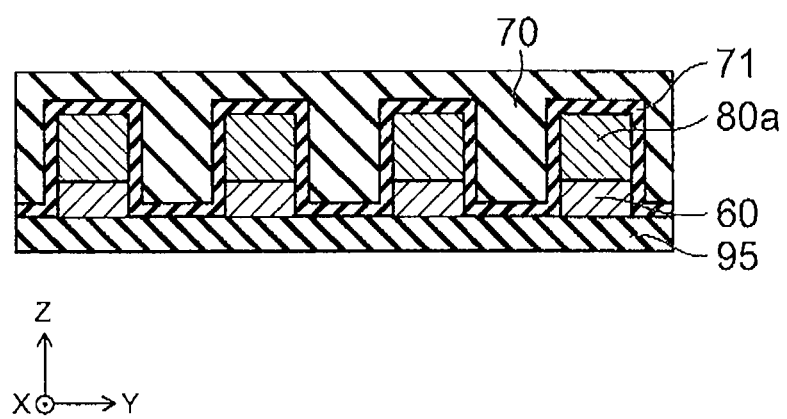

Next, as illustrated in FIG. 4B, the element isolation layer 70 is buried in the trench 96. Here, FIG. 4B illustrates a cross section of the stacked body cut substantially perpendicularly to the X-axis direction.

In this stage, the element isolation layer 70 is formed by using the application method which is good in filling property in order to bury a dielectric layer in the trench 96 of a high aspect ratio.

For example, in the case where the element isolation layer 70 mainly made of silicon oxide ($SiO_2$) is formed in the trench 96, the element isolation layer 70 is formed by the application method using a solution containing the raw material thereof. Specifically, the element isolation layer 70 mainly made of silicon oxide ($SiO_2$) is buried in the trench 96 by an application method such as spin coating using a perhydropolysilazane (PHPS) solution which is a polysilazane-based material.

The element isolation layer 70 buried in the trench 96 is what is called a low-k material, and is configured to have a lower dielectric constant than the dielectric film 71. For example, a porous dielectric layer is given as the structure of the element isolation layer 70.

The element isolation layer 70 may be formed by the physical vapor deposition (PVD) method or the chemical vapor deposition (CVD) method as well as the application method mentioned above.

After the element isolation layer 70 is disposed, the element isolation layer 70 may be heat-treated at, for example, not higher than 750° C. under a gas atmosphere containing at least one of oxygen, oxygen ion, ozone, oxygen radical, water, hydroxide ion, and hydroxyl group radical, for example. Alternatively, after the element isolation layer 70 is disposed, the element isolation layer 70 may be heat-treated at, for example, not higher than 750° C. under a gas atmosphere containing at least one of nitrogen, hydrogen, and inert gas.

Figure 5A:
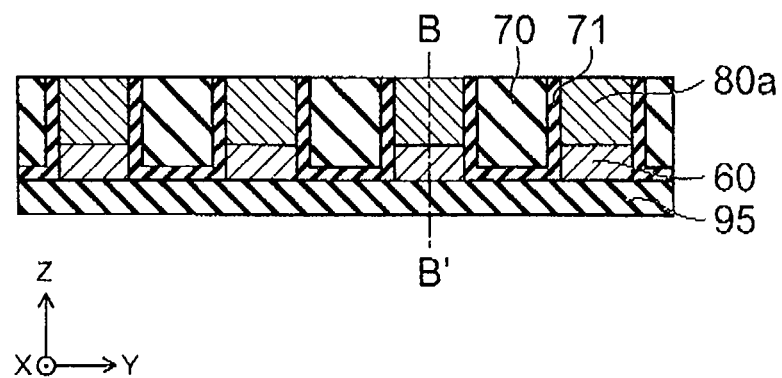

Next, as illustrated in FIG. 5A, CMP (chemical mechanical polishing) is performed on the element isolation layer 70 and the dielectric film 71 on the stacked body 80a to planarize the surfaces of the element isolation layer 70 and the stacked body 80a. Thereby, the surface of the stacked body 80a is exposed.

Figure 5B:
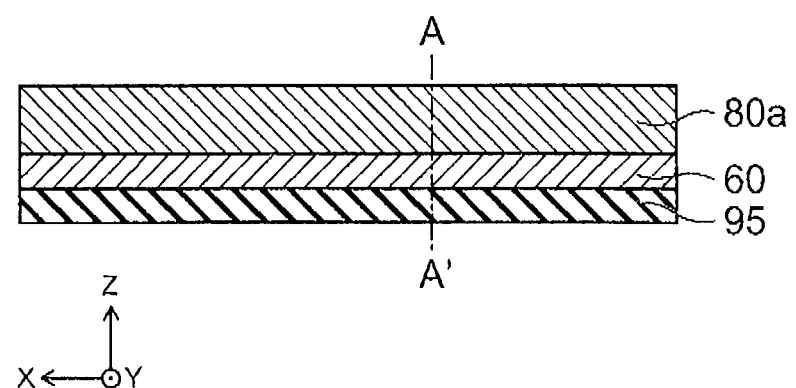

FIG. 5B illustrates a cross section taken along line B-B' of FIG. 5A. That is, the stacked body 80a is not separated in the cross section taken along line B-B' of FIG. 5A in this stage. Then, processing for dividing the stacked body 80a in the X-axis direction is performed.

Figure 6A:
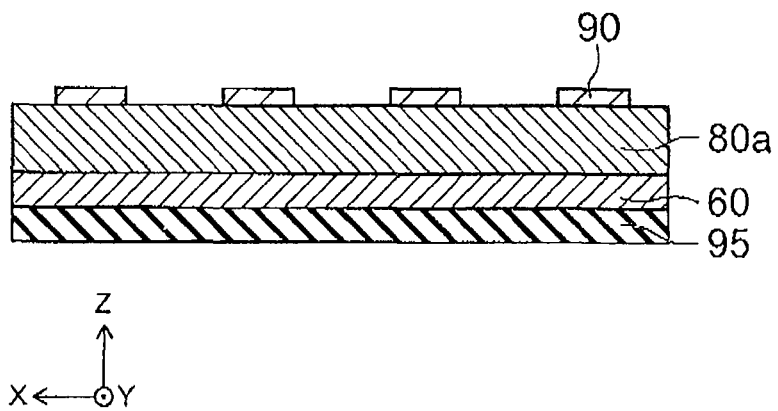

That is, as illustrated in FIG. 6A, the mask member 90 extending in the Y-axis direction is patterned on the stacked body 80a by the lithography technique or the like. Silicon oxide ($SiO_2$), for example, is used for the material of the mask member 90.

Figure 6B:
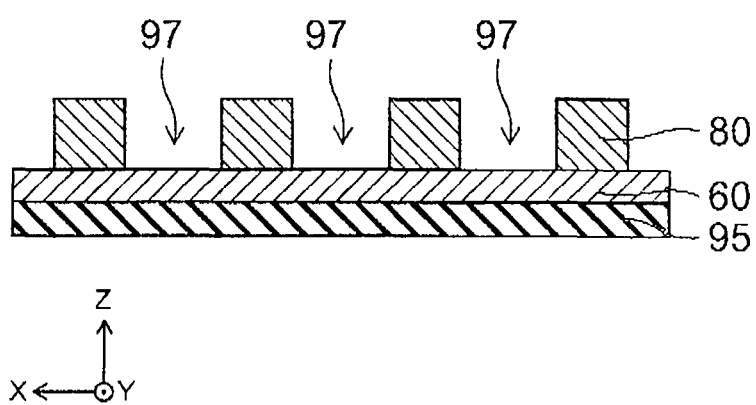

Next, as illustrated in FIG. 6B, the stacked body 80a is processed by RIE using the mask member 90 as a mask. Here, FIG. 6B illustrates a cross section of the stacked body and the like cut substantially perpendicularly to the Y-axis direction.

That is, the stacked body 80a mentioned above is processed by etching to form the memory cells 80 with island shapes on the interconnection layer 60. The width in the X-axis direction of a trench 97 is 40 nm, for example.

The RIE in this stage is performed while changing etching conditions for each coating film of the stacked body. For example, it is performed while changing gas for etching, discharge conditions, and the like for each coating film.

Specifically, halogen-based gas is used when etching the resistance change film 40. Here, $Cl_2$, $BCl_3$, and the like, for example, are used as the halogen-based gas. In the case where a material having a high vapor pressure is selected as the material of the resistance change film 40, the etching processing of the resistance change film 40 may be performed while heating.

When etching the electrode layers 10, 30 and 50, and the interconnection layer 60, a gas containing halogen-based gas is used. $NF_3$, $Cl_2$, and the like, for example, are used as the halogen-based gas.

Figure 7A:
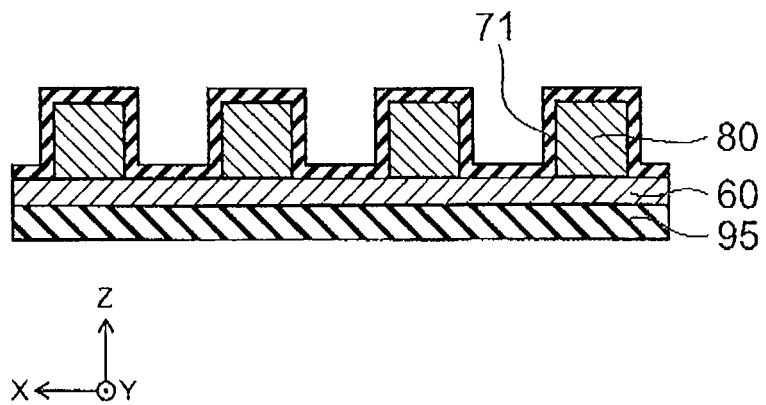

Next, as illustrated in FIG. 7A, the sidewall surface in the X-axis direction of the memory cell 80 and the like are coated with the dielectric film 71. Here, FIG. 7A illustrates a cross section when the stacked body and the like are cut substantially perpendicularly to the Y-axis direction.

That is, the upper surface and the sidewall surface in the X-axis direction of the memory cell 80 and the surface of the interconnection layer 60 on which the memory cell 80 is not disposed are coated with the dielectric film 71.

Here, the dielectric film 71 is formed by the ALD method, as described above. In regard to the source gas, for example, when silicon oxide is used for the material of the dielectric film 71, dichlorosilane ($SiH_2Cl_2$), tetrachlorosilane ($SiCl_4$), hexachlorosilane ($Si_2Cl_6$), tris(dimethylamino)silane (TD-MAS; $SiH(N(CH_3)_2)_3$), and the like are used as the source gas. The source gas is processed to be mixed with the gas of oxygen, ozone, oxygen radical, water, and the like. The processing temperature is 300° C. to 500° C.

Such ALD methods are good in step coverage properties, and the component elements are stacked and film-formed with the thickness of an atomic layer. Accordingly, the dielectric film 71 formed in the trench 97 has a configuration of a uniform film thickness and a dense film quality. For example, even if the trench 97 has a high aspect ratio (for example, aspect ratio >40), the dielectric film 71 having a uniform film thickness and a dense film quality is formed in the trench 97.

The dielectric film 71 in this stage may be formed by the molecular layer deposition (MLD) method as well as the ALD method. Also the molecular layer deposition (MLD) method forms a coating film having a uniform film thickness and a dense film quality described above.

The dielectric film 71 may be formed by the chemical vapor deposition (CVD) method or the physical vapor deposition (PVD) method as necessary.

Figure 7B:
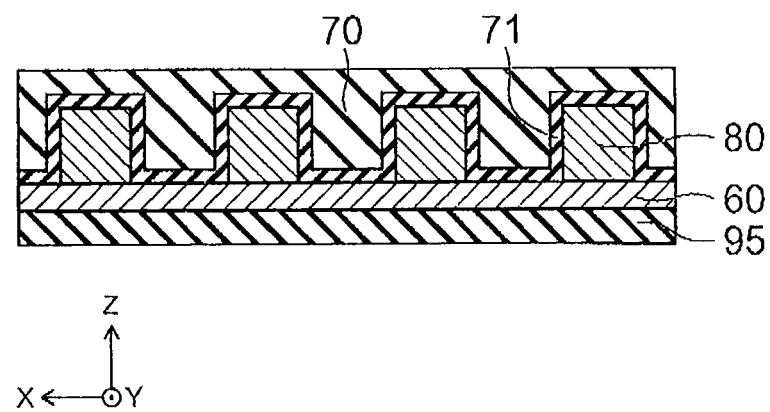

Next, as illustrated in FIG. 7B, the element isolation layer 70 is buried in the trench 97. Here, FIG. 7B illustrates a cross section when the stacked body is cut substantially perpendicularly to the Y-axis direction.

In this stage, the element isolation layer 70 is formed by using the application method in order to bury a dielectric layer in the trench 97 of a high aspect ratio.

For example, in the case where the element isolation layer 70 mainly made of silicon oxide ($SiO_2$) is formed in the trench 97, the element isolation layer 70 is formed by the application method using a solution containing the raw material of the element isolation layer 70. Specifically, the element isolation layer 70 mainly made of silicon oxide ($SiO_2$) is buried in the trench 97 by an application method such as spin coating using a perhydropolysilazane (PHPS) solution which is a polysilazane-based material.

The element isolation layer 70 buried in the trench 97 in this stage is what is called a low-k material, and is configured to have a lower dielectric constant than the dielectric film 71. For example, a porous dielectric layer is given as the structure of the element isolation layer 70.

The element isolation layer 70 may be formed by the physical vapor deposition (PVD) method or the chemical vapor deposition (CVD) method as well as the application method mentioned above.

After the element isolation layer 70 is disposed, the element isolation layer 70 may be heat-treated under a gas atmosphere containing at least one of oxygen, oxygen ion, ozone, oxygen radical, water, hydroxide ion, and hydroxyl group radical, for example. Alternatively, after the element isolation layer 70 is disposed, the element isolation layer 70 may be heat-treated under a gas atmosphere containing at least one of nitrogen, hydrogen, and inert gas.

Figure 8A:
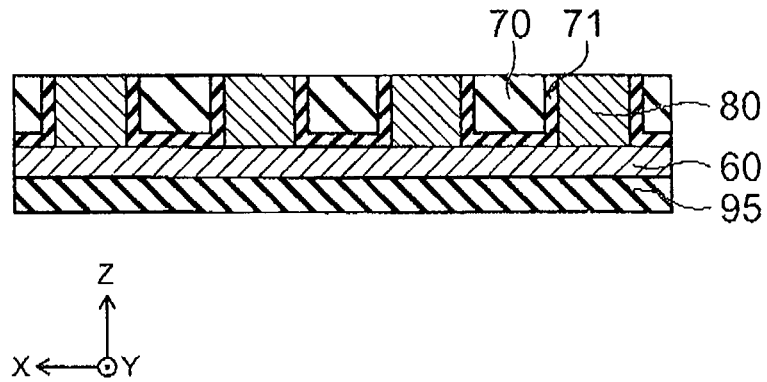

Next, as illustrated in FIG. 8A, CMP is performed on the element isolation layer 70 and the dielectric film 71 on the memory cell 80 to planarize the surfaces of the element isolation layer 70 and the memory cell 80. Thereby, the surface of the memory cell 80 is exposed.

Figure 8B:
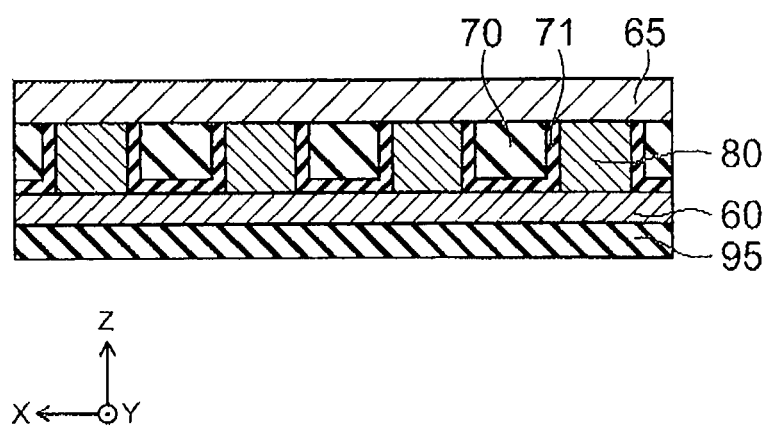

Next, as illustrated in FIG. 8B, the planar interconnection layer 65 is formed on the surfaces of the element isolation layer 70 and the memory cell 80. The interconnection layer 65 is formed by the sputtering method or the CVD method, for example.

After that, the interconnection layer 65 is processed by the lithography technique to dispose the patterned interconnection layers 65 on the memory cells 80 (see FIGS. 1A and 1B).

Thus, in this embodiment, the dielectric film 71 is formed by the ALD method, for example. Therefore, the dielectric film 71 having a uniform film thickness and a dense film quality is formed on the sidewall surface of the memory cell 80.

The element isolation layer 70 is formed by the application method, and a low-k material is used for the material thereof. A concentration of impurities contained in the element isolation layer 70 is higher than a concentration of impurities contained in the dielectric film 71.

Therefore, even if a minute amount of a solvent (for example, water) and/or impurities (for example, carbon-based impurities and nitrogen-based impurities) remaining in the element isolation layer 70 are diffused outside the element isolation layer 70, the memory cell 80 hardly deteriorates. That is, even if the element isolation layer 70 is formed by the application method, the high barrier properties of the dielectric film 71 suppress the degradation of the memory cell 80.

Furthermore, since the dielectric film 71 has a uniform film thickness and a dense film quality, the dielectric film 71 has high insulation properties. Therefore, a current leak between the memory cells 80 can be suppressed.

Furthermore, since a low-k material is used for the element isolation layer 70, the parasitic capacitance between the memory cells 80 is low. Therefore, high-speed operations of the ReRAM memory cell array 1a become possible.

Moreover, in this embodiment, the element isolation layer 70 in the trenches 96 and 97 is formed by the application method which provides high filling property. Therefore, even if the trenches 96 and 97 have a high aspect ratio, a void is hardly generated in the element isolation layer 70.

Figure 9:
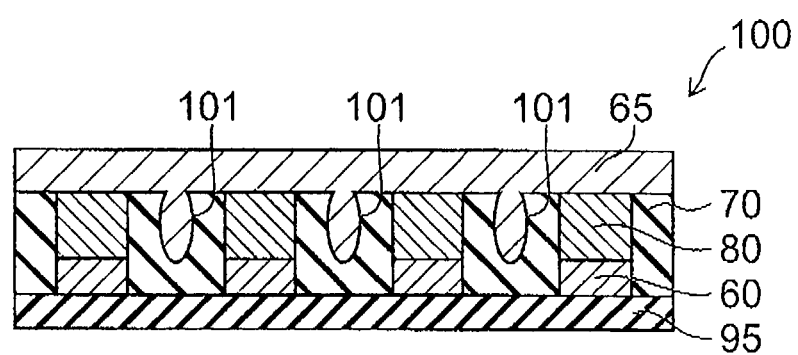
FIG. 9 is a schematic cross-sectional view for describing a ReRAM memory cell array of a comparative example.

For example, as a comparative example, FIG. 9 illustrates a ReRAM memory cell array 100 in which the element isolation layer 70 is formed by a method of bad filling property and a void 101 is generated in the element isolation layer 70.

In the ReRAM memory cell array 100, the void 101 is exposed at the upper surface of the element isolation layer 70 by CMP processing. The interconnection layer 65 is buried in the void 101.

When the ReRAM memory cell array 100 with such a configuration is operated, the electric field applied to the memory cell 80 occurs not only at the intersection of the interconnection layer 65 and the interconnection layer 60, but also between the interconnection layer 65 in the void 101 and the interconnection layer 60. Therefore, in the ReRAM memory cell array 100, the resistance change film 40 of the memory cell 80 cannot transit properly to the first state or the second state.

In contrast, in this embodiment, the element isolation layer 70 is formed by the application method which is good in filling property. Therefore, even in the case of the trenches 96 and 97 of a high aspect ratio, a void is hardly generated in the element isolation layer 70 in the trenches 96 and 97. Consequently, the resistance change film 40 of the memory cell 80 can transit properly to the first state or the second state. Thereby, the ReRAM memory cell array 1a can suppress wrong writing, wrong erasing, and wrong reading to/from the memory cell 80.

Thus, the ReRAM memory cell array 1a of high reliability is formed in this embodiment.

Second Embodiment

Next, another embodiment of the ReRAM memory cell array will now be described. In the following drawings, the same members as the ReRAM memory cell array 1a are marked with the same reference numerals, and a detailed description is omitted.

Figure 10A:
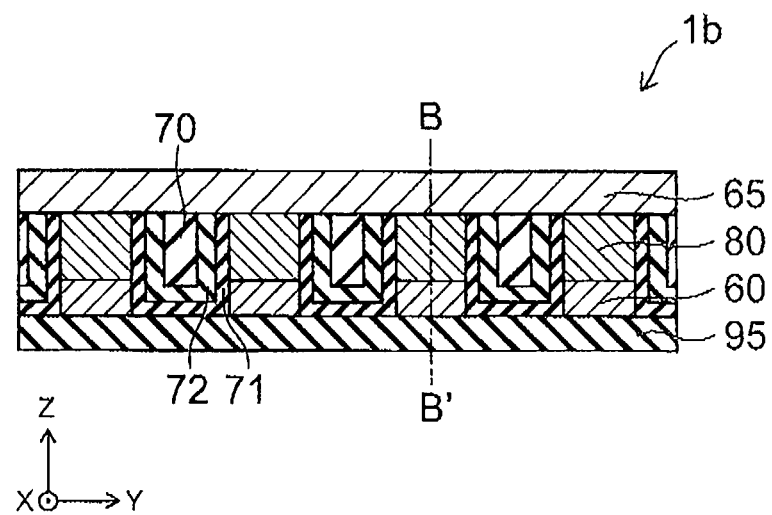
FIGS. 10A and 10B are schematic cross-sectional views of relevant parts of cell cross-sectional structures of a nonvolatile memory device.
Figure 10B:
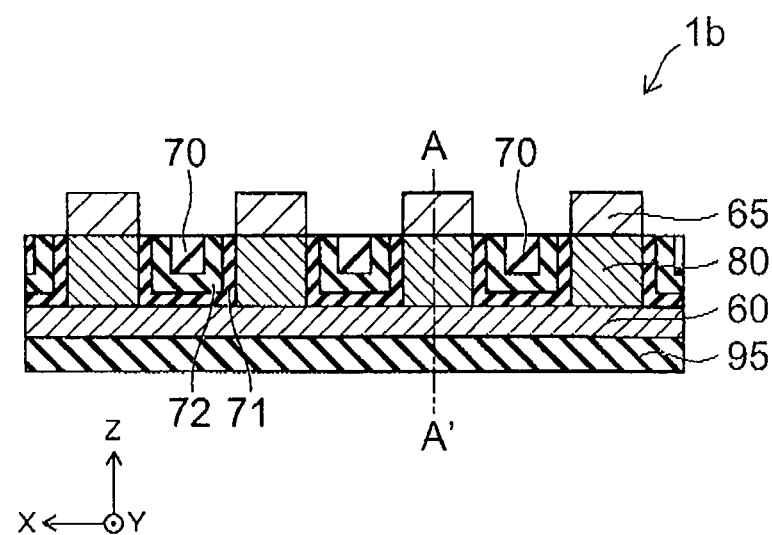

FIGS. 10A and 10B are schematic cross-sectional views of relevant parts of cell cross-sectional structures of a nonvolatile memory device according to this embodiment. Here, FIG. 10A illustrates a cross section taken along line A-A' of FIG. 10B, and FIG. 10B illustrates a cross section taken along line B-B' of FIG. 10A.

As illustrated in FIG. 10A, in a ReRAM memory cell array 1b, the interconnection layers 60 that are bit lines are provided on the substrate 95, the memory cells 80 are provided on the interconnection layer 60, and the interconnection layers 65 are provided on the memory cells 80.

Further, in the ReRAM memory cell array 1b, the element isolation layers 70 are provided periodically in order to ensure insulation between adjacent cells. Here, the element isolation layer 70 is formed by the application method, for example, and is a low-k material. In the ReRAM memory cell array 1b, a dielectric film 72 is further disposed between the element isolation layer 70 and the dielectric film 71.

The dielectric films 71 and 72 are formed by the ALD method, for example, and have a uniform film thickness and a dense film quality. That is, the dielectric films 71 and 72 are configured to have a higher density than the element isolation layer 70. Since the dielectric films 71 and 72 are configured to have a higher density than the element isolation layer 70, the dielectric films 71 and 72 are configured to have a higher density and a higher dielectric constant than the element isolation layer 70.

The material of the dielectric film 72 may be the same as the material of the dielectric film 71. However, the dielectric film 72 may be configured to have a lower dielectric constant than the dielectric film 71 in order to reduce the capacitance between the memory cells 80.

In the nonvolatile memory device, a plurality of such ReRAM memory cell arrays 1b may be stacked via an interlayer dielectric film (stacked in the Z-axis direction in the drawings). Thereby, a memory device of a larger memory capacity is obtained.

Next, a method for manufacturing the ReRAM memory cell array 1b of the nonvolatile memory device will now be described. However, FIG. 3A to FIG. 4A described above can be used also for the manufacturing process of the ReRAM memory cell array 1b; therefore, a description is given from the process immediately after FIG. 4A.

Figure 11A:
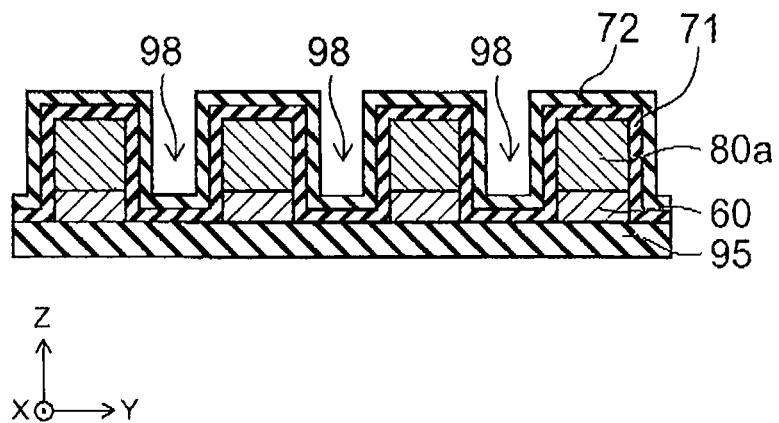
FIG. 11A to FIG. 15B are schematic cross-sectional views of relevant parts for describing a method for manufacturing the ReRAM memory cell array of the nonvolatile memory device.
Figure 11B:
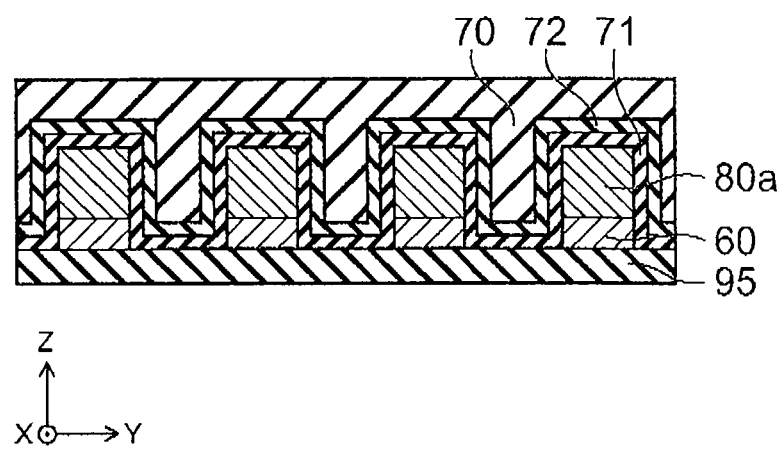
Figure 12:
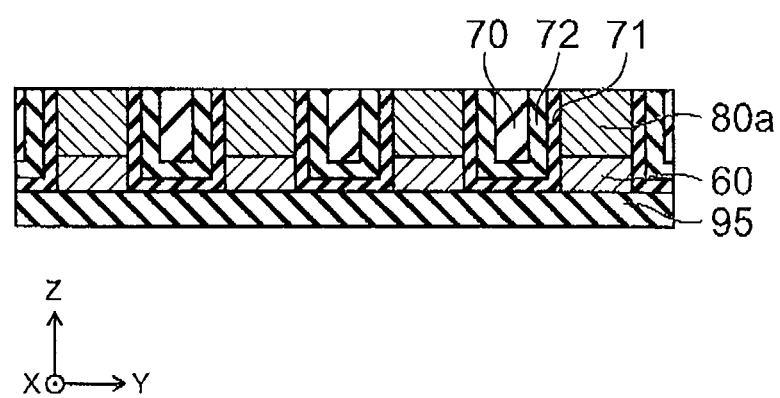

FIG. 11A to FIG. 12 are schematic cross-sectional views of relevant parts for describing a method for manufacturing the ReRAM memory cell array 1b of the nonvolatile memory device.

As illustrated in FIG. 11A, the upper and sidewall surfaces of the dielectric film 71 are covered with the dielectric film 72, Here, FIG. 11A illustrates a cross section when the stacked body and the like are cut substantially perpendicularly to the X-axis direction.

That is, the dielectric film 72 is formed by the ALD (atomic layer deposition) method. In regard to the source gas, for example, when silicon oxide is used for the material of the dielectric film 72, dichlorosilane ($SiH_2Cl_2$), tetrachlorosilane ($SiCl_4$), hexachlorosilane ($Si_2Cl_6$), tris(dimethylamino)silane (TDMAS; $SiH(N(CH_3)_2)_3$), and the like are used for the source gas. The source gas is processed to be mixed with the gas of oxygen, ozone, oxygen radical, water, and the like. The processing temperature is 300° C. to 500° C.

Such ALD methods are good in step coverage properties, and the component elements are stacked with the thickness of an atomic layer. Accordingly, the dielectric film 72 formed on the upper and sidewall surfaces of the dielectric film 71 has a configuration of a uniform film thickness and a dense film quality.

Furthermore, the dielectric film 72 may be formed by the molecular layer deposition (MLD) method as well as the ALD method, as necessary. Also the molecular layer deposition (MLD) method forms such a coating film as described above having a uniform film thickness and a dense film quality The dielectric film 72 may be formed by the chemical vapor deposition (CVD) method or the physical vapor deposition (PVD) method as necessary.

In this stage, the space between the stacked bodies 80a is not filled up with the dielectric film 72, but a trench 98 extending in the X direction is formed between the stacked bodies 80a.

Next, as illustrated in FIG. 11B, the element isolation layer 70 is buried in the trench 98. Here, FIG. 11B illustrates a cross section when the stacked body is cut substantially perpendicularly to the X-axis direction.

In this stage, the element isolation layer 70 is formed by using the application method as in the case described above in order to bury a dielectric layer in the trench 98 of a high aspect ratio.

The element isolation layer 70 buried in the trench 98 is what is called a low-k material, and is configured to have a lower dielectric constant than the dielectric films 71 and 72. For example, a porous dielectric layer is given as the structure of the element isolation layer 70.

The element isolation layer 70 may be formed by the physical vapor deposition (PVD) method or the chemical vapor deposition (CVD) method as well as the application method mentioned above.

Next, as illustrated in FIG. 12, CMP is performed on the element isolation layer 70 and the dielectric films 71 and 72 on the stacked body 80a to planarize the surfaces of the element isolation layer 70 and the stacked body 80a. Thereby, the surface of the stacked body 80a is exposed.

After that, as illustrated in FIG. 10B, the dielectric film 71 is formed on the sidewall surface in the X-axis direction of the memory cell 80 by the ALD method. Further, the dielectric film 72 is formed on the dielectric film 71 by the ALD method. The element isolation layer 70 is formed also in the cross section substantially perpendicular to the Y-axis direction.

Thus, in this embodiment, the dielectric films 71 and 72 are formed by the ALD method, for example. Therefore, the dielectric films 71 and 72 having a uniform film thickness and a dense film quality are formed in two layers on the sidewall surface of the memory cell 80.

The element isolation layer 70 is formed by the application method, and a low-k material is used for the material thereof.

Therefore, even if a minute amount of a solvent (for example, water) and/or impurities remaining in the element isolation layer 70 are diffused outside the element isolation layer 70, the memory cell 80 hardly deteriorates. That is, even if the element isolation layer 70 is formed by the application method, the high barrier properties of the dielectric films 71 and 72 of a two-layer structure suppress the degradation of the memory cell 80 further.

Furthermore, since the dielectric films 71 and 72 have a uniform film thickness and a dense film quality, the dielectric films 71 and 72 have high insulation properties. Therefore, a current leak between the memory cells 80 can be suppressed further.

Furthermore, since a low-k material is used for the element isolation layer 70, the capacitance between the memory cells 80 is low. Therefore, high-speed operations of the ReRAM memory cell array 1b become possible.

Moreover, the element isolation layer 70 of this embodiment is formed by the application method which provides high filling property. Therefore, a void is hardly generated in the element isolation layer 70.

Thereby, the ReRAM memory cell array 1b can suppress wrong writing, wrong erasing, and wrong reading to/from the memory cell 80.

Thus, the ReRAM memory cell array 1b of higher reliability is formed in this embodiment.

The dielectric film formed on the sidewall surface of the memory cell 80 is not limited to the two-layer structure, but may have three or more layers as necessary.

Third Embodiment

Next, still another embodiment of the ReRAM memory cell array will now be described.

This embodiment has a configuration in which the dielectric film 71 illustrated in FIGS. 1A and 1B is replaced with a dielectric film (the dielectric film 73 described later) that is formed by a different method from the dielectric film 71. A method for forming the dielectric film is described below. Here, in the following description, the processes until the interconnection layer 60 and the stacked body 80a are divided in the Y-axis direction across the trenches 96 on the substrate 95, which are illustrated in FIGS. 3A and 3B, are the same as the manufacturing process of the ReRAM memory cell array 1a; therefore, a description is given from the process thereafter.

FIG. 13A to FIG. 15B are schematic cross-sectional views of relevant parts for describing a method for manufacturing a ReRAM memory cell array 1c of a nonvolatile memory device.

Figure 13A:
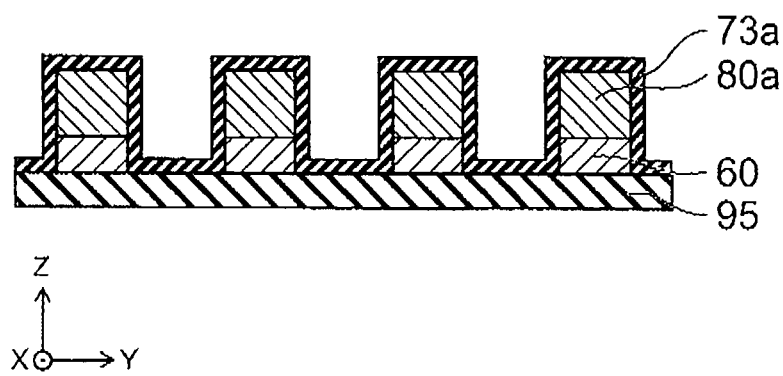

First, the upper and sidewall surfaces of the stacked body 80a, the sidewall surface of the interconnection layer 60, and the surface of the substrate 95 on which the interconnection layer 60 is not disposed of the form illustrated in FIG. 3B are covered with a precursor film 73a of the dielectric film 73 described later. FIG. 13A illustrates this state. FIG. 13A illustrates a cross section when the stacked body 80a and the like are cut substantially perpendicularly to the X-axis direction.

Here, the material of the precursor film 73a is mainly made of one of amorphous silicon (a-Si), polycrystalline silicon (poly-Si), epitaxial silicon, and a metal film of aluminum (Al), hafnium (HF), or the like, for example. The precursor film 73a like this is formed by the physical vapor deposition (PVD) method, the chemical vapor deposition (CVD) method, the molecular layer deposition (MLD) method, or the application method. The precursor film 73a is formed under an atmosphere in which oxygen (or oxidizing gas) does not exist.

When forming the precursor film 73a, the temperature of the under layer (the upper and sidewall surfaces of the stacked body 80a, the sidewall surface of the interconnection layer 60, and the surface of the substrate 95 on which the interconnection layer 60 is not disposed) is set at not higher than 400° C. For example, the temperature is set at 350° C.

Figure 13B:
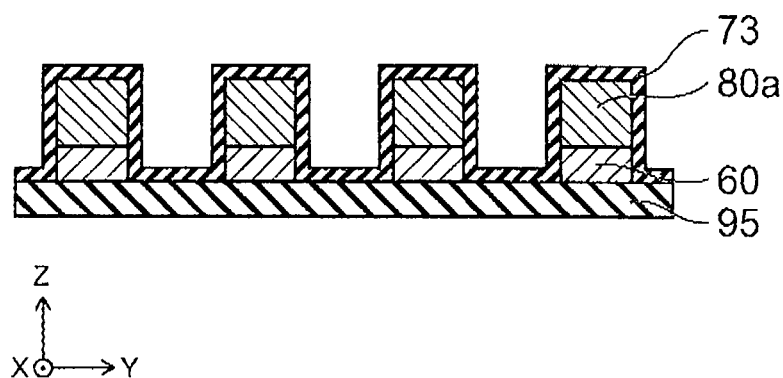

Next, as illustrated in FIG. 13B, the precursor film 73a is reformed into a dielectric film 73. The following (1) and (2) are given as the reforming method.

First, method (1) is as follows. The precursor film 73a is exposed to one of oxygen, oxygen ion, oxygen radical, oxygen plasma, ozone, water, hydroxide ion, and hydroxyl group radical to perform oxidation treatment of the precursor film 73a to change the precursor film 73a to the dielectric film 73 made of an oxide. The treatment temperature at this time is 300° C., for example.

Second, method (2) is as follows. The precursor film 73a is exposed to one of nitrogen, nitrogen ion, nitrogen radical, nitrogen plasma, ammonia, ammonium ion, amide, and ammonia radical to perform nitriding treatment of the precursor film 73a to change the precursor film 73a to the dielectric film 73 made of an nitride. The treatment temperature at this time is 300° C., for example.

The treatment of (2) may be performed after the treatment of (1), or the treatment of (1) may be performed after the treatment of (2). In particular, causing the dielectric film 73 to contain a nitride can suppress further the transfer of impurities from the resistance change film 40 to the element isolation layer 70 and the transfer of impurities from the element isolation layer 70 to the resistance change film 40 in subsequent processes.

That is, in this stage, the precursor film 73a is once formed at a low temperature of not higher than 400° C. under an atmosphere in which oxygen does not exist, and subsequently oxidation treatment or nitriding treatment is performed at a low temperature of not higher than 400° C. to form the dielectric film 73.

By forming the dielectric film 73 by such two-step processes, the sidewall surface of the resistance change film 40 in the stacked body 80a is once covered with the precursor film 73a, and subsequently the precursor film 73a itself is reformed to the dielectric film 73. That is, in the process of forming the dielectric film 73, the dielectric film 73 is formed on the sidewall surface of the resistance change film 40 without exposing the sidewall surface of the resistance change film 40 to oxygen (or oxidizing gas). Therefore, the sidewall surface of the resistance change film 40 is not oxidized excessively, and a variation does not occur between the compositions of the sidewall surface and the inside of the resistance change film 40.

Furthermore, in the process of forming the dielectric film 73, the dielectric film 73 is formed by low-temperature treatment of 400° C. Therefore, the resistance change film 40 in the stacked body 80a is prevented from being thermally-damaged, and composition change of the resistance change film 40 hardly occurs during manufacturing processes. Thereby, the resistance change film 40 with a desired composition can be formed.

For example, in the case of a comparative example in which the dielectric film 73 is formed by CVD using a temperature higher than 400° C., the sidewall surface of the resistance change film 40 is exposed directly to oxygen (or oxidizing gas) or is thermally-damaged. Therefore, if the dielectric film 73 is formed by high-temperature CVD, there are cases where a variation in composition in the resistance change film 40 and/or a composition change of the resistance change film 40 are caused. Here, the composition change is caused by the transfer or diffusion of elements in the resistance change film 40 and the like, for example.

Thus, if an unevenness in composition or a composition change in the resistance change film 40 occurs, it causes bad effects of a variation in switching characteristics (for example, forming voltage (Vf), set voltage (Vs) and reset voltage (Vrs)) of the resistance change film 40, and unstable switching characteristics of the resistance change film 40.

In contrast, this embodiment does not cause unevenness in the composition of the resistance change film 40 even if the dielectric film 73 is formed, and can keep the composition constant before and after the formation of the dielectric film 73, as described above. Therefore, switching characteristics of the resistance change film 40 are stabilized.

Since the precursor film 73a has been oxidized or nitrided, silicon oxide ($SiO_2$), silicon nitride ($Si_3N_4$), aluminum nitride (AlN), alumina ($Al_2O_3$), silicon oxynitride (SiON), hafnia ($HfO_2$), and the like are used for the material of the dielectric film 73.

Figure 14A:
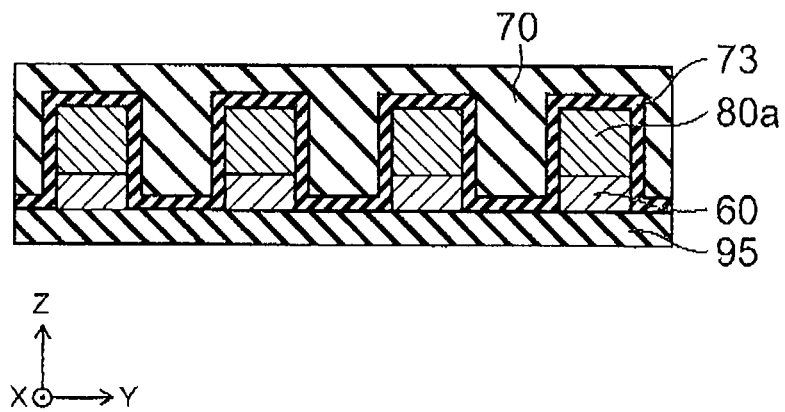

Next, as illustrated in FIG. 14A, the element isolation layer 70 is buried in the trench 96.

In this stage, as described above, the element isolation layer 70 is formed by using the application method which is good in filling property in order to bury a dielectric layer in the trench 96 of a high aspect ratio. The element isolation layer 70 may be formed by the physical vapor deposition (PVD) method or the chemical vapor deposition (CVD) method as well as the application method mentioned above. After the element isolation layer 70 is disposed, the element isolation layer 70 may be heat-treated at, for example, not higher than 750° C. under a gas atmosphere containing at least one of oxygen, oxygen ion, ozone, oxygen radical, water, hydroxide ion, and hydroxyl group radical, for example. Alternatively, after the element isolation layer 70 is disposed, the element isolation layer 70 may be heat-treated at, for example, not higher than 750° C. under a gas atmosphere containing at least one of nitrogen, hydrogen, and inert gas.

Even if such processing is performed, since the dielectric film 73 is formed on the sidewall surface of the stacked body 80a, the transfer of ions from the resistance change film 40 to the element isolation layer 70 or the transfer of ions from the element isolation layer 70 to the resistance change film 40 can be suppressed further.

Figure 14B:
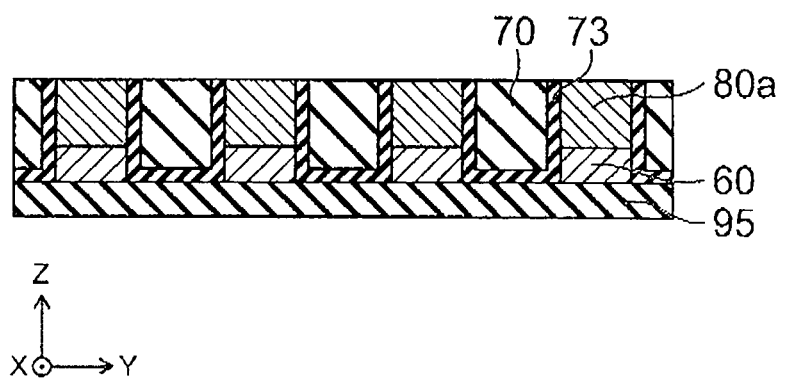

Next, as Illustrated in FIG. 14B, CMP is performed on the element isolation layer 70 and the dielectric film 73 on the stacked body 80a to planarize the surfaces of the element isolation layer 70 and the stacked body 80a. Thereby, the surface of the stacked body 80a is exposed.

Figure 15A:
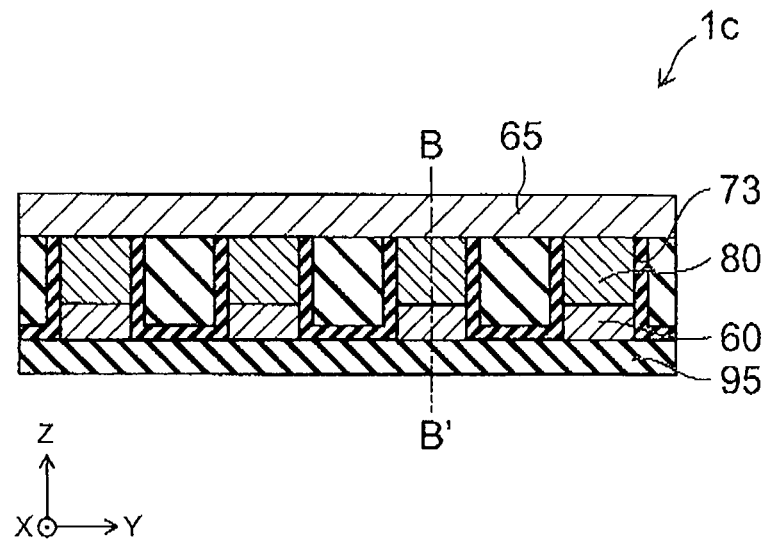
Figure 15B:
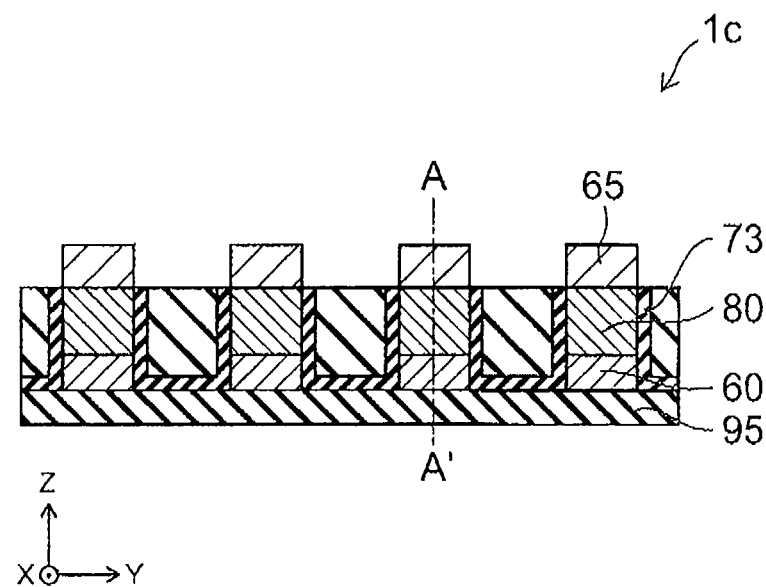

Then, the manufacturing processes described above are performed also in the Y-axis direction illustrated in FIG. 14B to form finally the ReRAM memory cell array 1c illustrated in FIGS. 15A and 15B. Here, FIG. 15A illustrates a cross section taken along line A-A' of FIG. 15B, and FIG. 15B illustrates a cross section taken along line B-B' of FIG. 15A.

As illustrated in FIG. 15A, in the ReRAM memory cell array 1c, the interconnection layers 60 are provided on the substrate 95, the memory cells 80 are provided on the interconnection layer 60, and the interconnection layers 65 are provided on the memory cells 80.

Further, in the ReRAM memory cell array 1c, the element isolation layers 70 are disposed periodically in order to ensure insulation between adjacent cells. The dielectric film 73 is disposed between the element isolation layer 70, and the memory cell 80 and the interconnection layer 60. The dielectric film 73 is configured to have a uniform film thickness and a dense film quality. That is, the dielectric film 73 is configured to have a higher density than the element isolation layer 70. Further, since in general the dielectric constant of a dielectric film increases as the density thereof increases, the dielectric film 73 is configured to have a higher dielectric constant than the element isolation layer 70. Physical property values such as density and dielectric constant and the thickness of the dielectric film 73 can be made equal to the dielectric film 71 described above by adjusting conditions for the film-formation of the dielectric film 73.

Therefore, also in the ReRAM memory cell array 1c, even if a minute amount of a solvent (for example, water) and/or impurities (for example, carbon-based impurities and nitrogen-based impurities) remaining in the element isolation layer 70 are diffused outside the element isolation layer 70, the memory cell 80 hardly deteriorates. That is, even if the element isolation layer 70 is formed by the application method, the high barrier properties of the dielectric film 73 suppress the degradation of the memory cell 80.

Furthermore, since the dielectric film 73 has a uniform film thickness and a dense film quality, the dielectric film 73 has high insulation properties. Therefore, a current leak between the memory cells 80 can be suppressed.

Furthermore, since a low-k material is used for the element isolation layer 70, the capacitance between the memory cells 80 is low. Therefore, high-speed operations of the ReRAM memory cell array 1c become possible.

A plurality of such ReRAM memory cell arrays 1c may be stacked via an inter-layer dielectric film (stacked in the Z-axis direction in the drawings). Thereby, a memory device of a larger memory capacity is obtained.

Fourth Embodiment

Figure 16A:
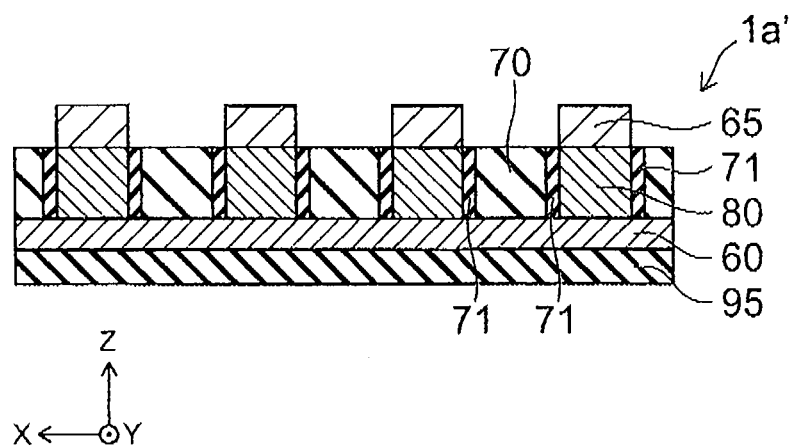
FIGS. 16A and 16B are schematic cross-sectional views of relevant parts for describing a variation of the cell cross-sectional structures of the nonvolatile memory device.
Figure 16B:
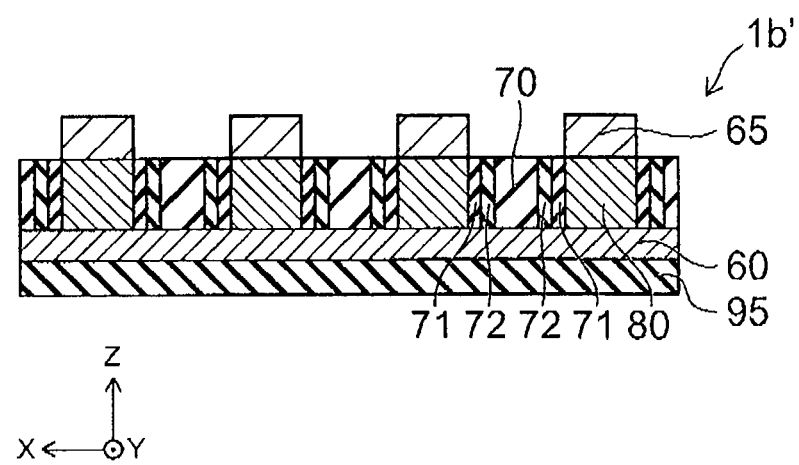

FIGS. 16A and 16B are schematic cross-sectional views of relevant parts for describing modification examples of the cell cross-sectional structure of the nonvolatile memory device according to this embodiment.

A ReRAM memory cell array 1a' illustrated in FIG. 16A is a modification of the structure of the ReRAM memory cell array 1a. In the ReRAM memory cell array 1a', the dielectric film 71 on the interconnection layer 60 illustrated in FIGS. 1A and 1B is removed.

Thereby, the ReRAM memory cell array 1a' reduces the interconnection capacitance of the interconnection layer 60 as compared with the ReRAM memory cell array 1a, and enables higher-speed operations.

Further, a ReRAM memory cell array 1b' illustrated in FIG. 16B is a modification of the structure of the ReRAM memory cell array 1b. In the ReRAM memory cell array 1b', the dielectric films 71 and 72 on the interconnection layer 60 illustrated in FIGS. 1A and 1B are removed.

That is, FIGS. 16A and 16B illustrate configurations in which the bottom surface of the element isolation layer 70 is in contact with the interconnection layer 60 that is the first interconnection, and at lease one dielectric film having a higher density than the element isolation layer 70 is disposed on the sidewall surface of the memory cell 80.

Thereby, the ReRAM memory cell array 1b' reduces the interconnection capacitance of the interconnection layer 60 as compared with the ReRAM memory cell array 1b, and enables higher-speed operations.

Hereinabove, embodiments of the invention are described with reference to specific examples. However, the embodiments are not limited to these specific examples. That is, one skilled in the art may perform appropriately design modifications on the above specific examples. Such modifications also are included in the scope of the present invention to the extent that the purport of the invention is included. For example, components of the specific examples described above and the arrangement, material, conditions, shape, size, and the like thereof are not limited to those illustrated but may be appropriately altered.

Further, components of the embodiments described above may be compounded within the extent of technical feasibility; and combinations of them are included in the scope of the invention to the extent that the purport of the invention is included.

Furthermore, various alterations and modifications within the spirit of the invention will be readily apparent to those skilled in the art. All such alterations and modifications should therefore be seen as within the scope of the invention.

The invention claimed is:

1. A nonvolatile memory device comprising:
   at least one first interconnection extending in a first direction;
   at least one second interconnection disposed above the first interconnection and extending in a second direction nonparallel to the first direction;
   a memory cell disposed between the first interconnection and the second interconnection at an intersection of the first interconnection and the second interconnection and including a memory element;
   an element isolation layer disposed between the memory cells; and
   at least one dielectric film with a higher density than the element isolation layer being disposed on a sidewall surface of the memory cell,
   the element isolation layer including a low-k material, a dielectric constant of the element isolation layer being lower than a dielectric constant of the dielectric film, a sidewall surface and a bottom surface of the element isolation layer being covered with the continuous dielectric film.

2. The device according to claim 1, wherein a concentration of impurities contained in the element isolation layer is higher than a concentration of impurities contained in the dielectric film.

3. The device according to claim 1, wherein the dielectric film includes a first dielectric film and a second dielectric film, the first dielectric film with a higher density than the element isolation layer is disposed on the sidewall surface of the memory cell, and the second dielectric film with a lower dielectric constant than the first dielectric film and with a higher density than the element isolation layer is disposed on the first dielectric film.

4. The device according to claim 1, wherein a rectifying element is provided in the memory cell.

* * * * *